(12) United States Patent
Siade et al.

(10) Patent No.: US 7,355,386 B2
(45) Date of Patent: Apr. 8, 2008

(54) METHOD OF AUTOMATICALLY CARRYING IC-CHIPS, ON A PLANAR ARRAY OF VACUUM NOZZLES, TO A VARIABLE TARGET IN A CHIP TESTER

(75) Inventors: Randy Neaman Siade, Chandler, AZ (US); James Mason Brafford, Mission Viejo, CA (US); James Downie, Mission Viejo, CA (US)

(73) Assignee: Delta Design, Inc., Poway, CA (US)

( * ) Notice: Subject to any disclaimer, the term of this patent is extended or adjusted under 35 U.S.C. 154(b) by 95 days.

(21) Appl. No.: 11/282,209

(22) Filed: Nov. 18, 2005

(65) Prior Publication Data
US 2007/0115015 A1    May 24, 2007

(51) Int. Cl.
*G01R 31/26*    (2006.01)
(52) U.S. Cl. .................. 324/158.1; 324/765

(58) Field of Classification Search ........ 324/758–765, 324/158.1; 702/97; 700/121; 228/102; 414/222.01, 744.1, 744.8
See application file for complete search history.

(56) References Cited

U.S. PATENT DOCUMENTS

| | | | |
|---|---|---|---|
| 4,615,093 A | | 10/1986 | Tews et al. |
| 5,447,266 A | * | 9/1995 | Misono ................ 228/102 |
| 5,608,642 A | * | 3/1997 | Onodera .............. 700/213 |
| 5,788,084 A | * | 8/1998 | Onishi et al. ......... 209/573 |
| 6,587,743 B1 | * | 7/2003 | White et al. .......... 700/121 |
| 6,774,651 B1 | * | 8/2004 | Hembree ............. 324/758 |
| 7,091,737 B2 | * | 8/2006 | Norris ................. 324/765 |

FOREIGN PATENT DOCUMENTS

| | | |
|---|---|---|
| WO | WO 85/02088 | 5/1985 |
| WO | WO 00/45230 | 8/2000 |
| WO | WO 2004/032207 A1 | 4/2004 |

* cited by examiner

*Primary Examiner*—Vinh P. Nguyen
(74) *Attorney, Agent, or Firm*—Foley & Lardner LLP (57) ABSTRACT

A method of automatically carrying IC-chips, on a planar array of vacuum nozzles, to a variable target in a chip tester uses a set of laser distance sensors to align the vacuum nozzles with the target. Alignment occurs when certain combinations of distance and distance changes are sensed.

13 Claims, 6 Drawing Sheets

METHOD OF AUTOMATICALLY CARRYING IC-CHIPS, ON A PLANAR ARRAY OF VACUUM NOZZLES, TO A VARIABLE TARGET IN A CHIP TESTER

BACKGROUND OF THE INVENTION

This invention relates to methods of automatically aligning IC-chips (integrated circuit chips) with a target in a system where the target has a set of co-ordinates which are indeterminate. This invention also relates to apparatus for automatically performing such methods.

In the prior art, one particular method of the above type is described in U.S. Pat. No. 6,774,651. This patent '651 issued on Aug. 10, 2004, and is entitled METHOD FOR ALIGNING AND CONNECTING SEMICONDUCTOR COMPONENTS TO SUBSTRATES.

FIG. 4 of patent '651 illustrates one preferred apparatus which performs the patented method. This apparatus includes a platform assembly 22 which is moveable, and a chuck assembly 24 which is stationary and spaced-apart from the platform assembly 22.

The platform assembly 22 includes a vacuum nozzle 38 which holds an IC-chip 10. The vacuum nozzle 38 is attached to, and moved by, a hexapod which is comprised of six linear actuators 34. This hexapod is able to move the IC-chip 10 parallel to three orthogonal axis, and is able to rotate the IC-chip 10 about those three axis.

The chuck assembly 24 holds a substrate 12 for the IC-chip 10. Thus, the substrate 12 is the target with which the IC-chip 10 needs to be aligned. More specifically, the IC-chip 10 has a face 13 with one set of electrical contacts 14; the substrate 12 has a face 15 with another set of electrical contacts 16; and these two sets of electrical contacts need to be aligned with each other and connected together.

To perform the alignment process in patent '651, the platform assembly 22 includes one height gauge 42 and one camera 44; and, the chuck assembly 24 also includes one height gauge 52 and one camera 50. How these four components are used in the alignment process is described in patent '651 at line 37 of column 7 to line 11 of column 8, which is quoted below.

"During an aligning and connecting process, the moving platform 32 can be moved such that the height gauge 42 is proximate to the substrate 12, and is able to determine the distance between the height gauge 42 and the substrate 12. This distance information can be converted into a signal, which can be optically or electrically transmitted to the controller 46. The distance information gives a Z-axis coordinate for the substrate 12."

"Similarly, the moving platform 32 can be moved such that the camera 44 is proximate to the substrate 12 and can generate an image of the facing surface 15 of the substrate 12. The visual image can be used to identify three reference points X1, X2, X3 (FIG. 3) on the facing surface 15. The references points X1, X2, X3 can be known features of the substrate 12, such as the substrate contacts 16, or can be dedicated alignment fiducials formed on the substrate 12. This image is then converted into a signal which can be optically or electrically transmitted to the controller 46. By noting the X-axis and Y-axis coordinates of the reference points X1, X2, X3, and the Z-axis coordinate obtained by the height gauge 42, the position and orientation of the plane containing the reference points can be determined. This calculation can be performed by the controller 46 or can be performed by another computer (not shown) in signal communication with the controller 46."

"The position and orientation of the component 10 can be determined in a similar manner. Specifically, a camera 50 and a height gauge 52 are mounted on a base 48 of the chuck assembly 24. Operation of the platform assembly 22 allows the component 10 to be placed proximate to the height gauge 52 to determine distance information and the Z-axis coordinate of the component 10. Similarly, the component 10 can be placed proximate to the camera 50, and a visual image can then be obtained and communicated to the controller 46. The visual image can be used to identify the X-axis and Y-axis coordinates of at least three points Y1, Y2, Y3 (FIG. 3) on the facing surface 13 of the component 10. Again the three points can be features such as the component contacts 14 or can be dedicated alignment fiducials. Using this information and the Z-axis coordinate from the height gauge 52, the orientation and position of the component 10 can be calculated by the controller 46 or another computer in signal communication with the controller."

From the above quote, it is clear that the alignment method of patent '651 depends on obtaining two dimensional images from the cameras 44 and 50, and digitally processing those images. In particular, reference points X1, X2, and X3 need to be identified in the two dimensional image of surface 15 on the substrate 12, and reference points Y1, Y2, and Y3 need to be identified in the two dimensional image of surface 13 on the IC-chip 10. Then, the X and Y co-ordinates of these reference points in the actual three dimensional system need to be determined from the two dimensional images. By comparison, with the present invention, no cameras are used and no digital images are processed.

Several alternative embodiments to the FIG. 4 apparatus are also shown in FIGS. 5-10 of patent '651. However, each of those alternative embodiments still include the two cameras that were described above.

Also in the prior art, another method of automatically aligning IC-chips with a target is described in U.S. Pat. No. 6,587,743. This patent '743 issued on Jul. 1, 2003, and is entitled PICK AND PLACE TEACHING METHOD AND APPARATUS FOR EMPLEMENTING THE SAME.

FIG. 1A of patent '743 illustrates a side view of one particular system which implements the claimed method. This FIG. 1A system includes a vacuum nozzle 15 which moves parallel to three orthogonal axis X, Y, and Z, and which also rotates around the Z axis.

As one step of the alignment process, the laser source 50 emits a laser beam in the X-Y plane, while the vacuum nozzle 15 is moved along the Z-axis through the laser beam. This step is described in patent '743 at lines 1-8 of column 7, which is quoted below.

"The Z-axis initialization is described in FIG. 2. In preferred aspects, the laser align system is used to determined the Z=0 point. Z=0 is defined as that point at which the laser align unit transitions between being able to "see" nozzle 15 and being unable to see nozzle 15. That is, the position is defined such that nozzle 15 blocks the laser align beam for all positive Z and does not block the beam for all negative Z."

As another step of the alignment process, the laser source 50 emits a laser beam in the X-Y plane, while the vacuum nozzle 15 holds an electronic device (such as an IC-chip) which is rotated around the Z-axis in the laser beam. This step is described in patent '743 at lines 38-50 of column 9, which is quoted below.

"Briefly, the laser align unit takes measurements as the device is rotated. For example, one or more sensors monitor which of one or more laser beams is interrupted during a rotation of the device. At any given time the image can be characterized by a width and a center position. The laser align unit identifies the four positions (corresponding to the four sides of the device) at which the image exhibits local width minima, and returns the center position associated with each of the four positions. Using these four center coordinates, the software is able to compute a correcting move for the X, Y, and angle coordinates."

From the above two quotes, it is seen that the alignment method in patent '743 depends on the emission of a laser beam by a source that is spaced-apart from a laser sensor, and the detection of when the emitted beam is broken by an object which is moved in a straight line or rotated between the source and the sensor. By comparison, with the present invention, no such breakage of a laser beam occurs.

BRIEF SUMMARY OF THE INVENTION

The present invention which is claimed herein is a method of automatically carrying IC-chips, on a planar array of vacuum nozzles, to a variable target in a chip tester. This method includes the following six steps.

Step one measures a set of distances, to a reference in the chip tester for the target, with a set of lasers that are attached to the planar array of nozzles.

Step two selects a direction and/or angle of movement as a function of the measured set of distances, using a control module in the chip tester.

Step three moves the planar array of nozzles, via a robotic arm in the chip tester, by an increment in the direction and/or angle selected by the control module.

Step four repeats the above steps one, two, and three until the control module detects that the distances measured by the lasers meet a predetermined criteria.

Step five stores control signals from encoders in the chip tester which identify the particular position of the robotic arm when the distances measured by the lasers meet the predetermined criteria.

Step six carries IC-chips on the planar array of nozzles while the control module uses the stored control signals to move the robotic arm to the particular position which is identified in step five.

With the above method, no images by any cameras are taken, and no digital processing of any images occurs. Also with the above method, no detection is made of when an object blocks or passes a laser beam, as the object is moved through the laser beam.

In one particular version of the present invention, the measuring step (step one) uses only three lasers to measure three distances perpendicular to the planar array of nozzles.

In another particular version of the present invention, the measuring step uses three lasers to measure three distances perpendicular to the planar array of nozzles and uses three additional lasers to measure three additional distances parallel to the planar array of nozzles.

In still another particular version of the present invention, the measuring step uses three lasers to measure distances perpendicular to the planar array of nozzles and only one additional laser to measure distances parallel to the planar array of nozzles.

In yet another particular version of the present invention, the measuring step uses three lasers to measure distances perpendicular to the planar array of nozzles and only two additional lasers to measure distances parallel to the planar array of nozzles.

DETAILED DESCRIPTION

The details of one particular chip testing system, which operates in accordance with the present inventory, will now be described with reference to FIG. 1. This FIG. 1 chip testing system includes all of the components 10-24 which are interconnected as shown.

Figure 1:
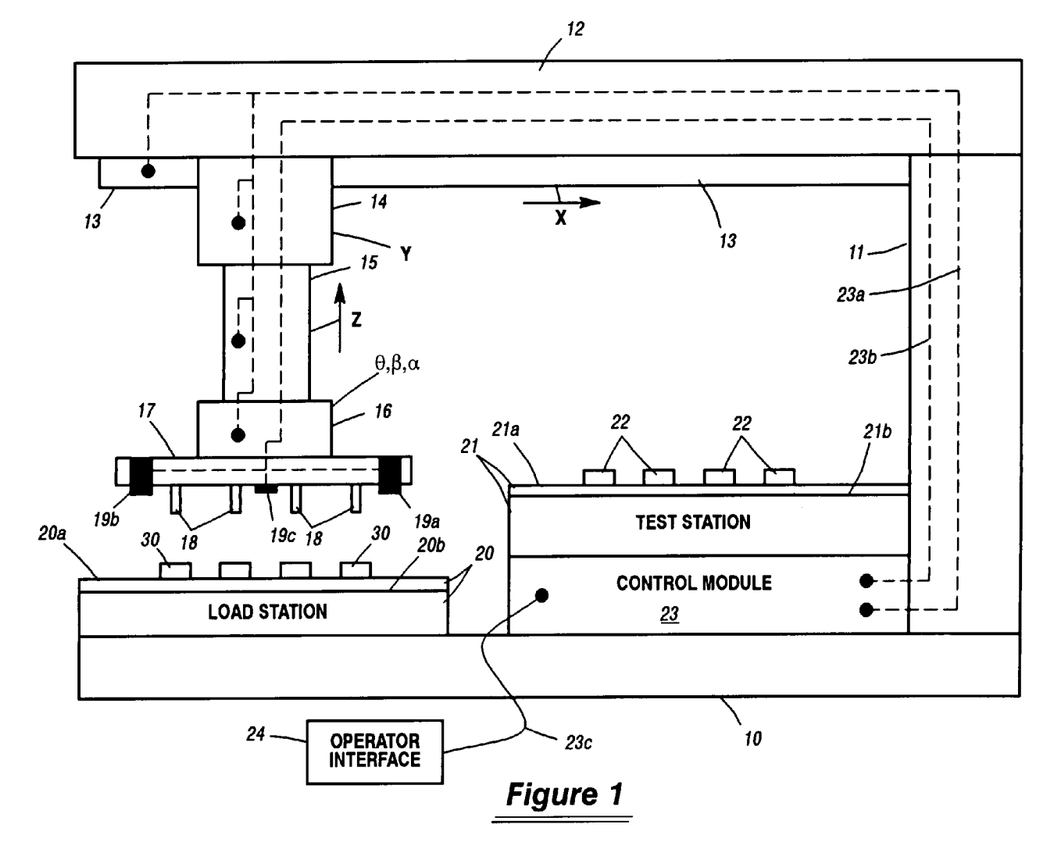
FIG. 1 is a side view of one particular chip testing system which automatically carries IC-chips, on a planar array of vacuum nozzles, to a variable target in accordance with the present invention.

Components 10, 11, and 12 in FIG. 1 together comprise the frame of the chip testing system. Component 10 is the base of the frame; component 11 is the back of the frame; and component 12 is the top of the frame.

Components 13, 14, 15, and 16 in FIG. 1 together comprise a robotic arm in the chip testing system. Component 13 is a part of the arm which moves components 14, 15, and 16 in the "X" direction. Component 14 is a part of the arm which moves components 15 and 16 in the "Y" direction. Component 15 is a part of the arm which moves component 16 in the "Z" direction. Component 16 is a part of the arm which tilts in the θ, β, and α directions.

The "X" direction is along a horizontal axis which is indicated by a horizontal arrow in FIG. 1. The "Z" direction is along a vertical axis which is indicated by a vertical arrow in FIG. 1. The "Y" direction is along a horizontal axis which is perpendicular to the "X" axis and the "Z" axis. The θ, β, and α directions are angular directions which respectively rotate about the "X" axis, the "Y" axis, and the "Z" axis.

Component 17 in FIG. 1 is a planar carrier which is rigidly attached to component 16 of the robotic arm. This carrier 17 is moved to various positions by components 13-16 of the robotic arm.

Each of the components 18 in FIG. 1 is a vacuum nozzle which is rigidly attached to the carrier 17. Each of these vacuum nozzles 18 has an open end which is adapted to hold an IC-chip. The open end of all of the vacuum nozzles 18 lie in a single plane. In the FIG. 1 chip testing system, only one row of four vacuum nozzles can be seen; however, a second row of four additional vacuum nozzles lies behind that one row and is hidden from view.

Each of the components 19a, 19b, and 19c in FIG. 1 is a laser distance sensor which is rigidly attached to the carrier 17. Each of these laser distance sensors measure distance perpendicular to the plane where the open end of the vacuum nozzles lie. To measure these distances, each laser distance sensor emits a laser beam, receives a reflected beam, detects the time interval which occurs between the two beans, and calculates distance as a function of the detected time interval.

Component 20 in FIG. 1 is a load station in the chip testing system. This load station 20 has a surface 20a which is completely planar, except that the surface has two steps. Only one step 20b can be seen in FIG. 1. The other step is perpendicular to step 20b and is hidden from view in FIG. 1. These steps have a significance which will be described later in conjunction with FIGS. 2 and 3A-3F.

The planar surface 20a is used to temporarily hold the IC-chips 30 that are to be tested. These chips 30 are placed on the surface 20a (by a mechanism not shown) with the exact same center-to-center spacing as the vacuum nozzles 18 on the carrier 17.

Component 21 in FIG. 1 is a test station in the chip testing system. This test station 21 has a surface 21a which is completely planar except that the surface has two steps. Only one step 21b can be seen in FIG. 1. The other step is perpendicular to step 21b and is hidden from view in FIG. 1. Here again, these steps have a significance which will be described later in conjunction with FIGS. 2 and 3A-3F.

Each of the components 22 is a socket for holding an IC-chip while the chip is tested. These sockets are attached to the planar surface 21a with the exact same center-to-center spacing as the vacuum nozzles 18 on the carrier 17.

In addition to the load station 20 and the test station 21, the chip testing system also includes an unload station which is hidden from view in FIG. 1. This unload station lies behind the load station 20 in the "Y" direction. The IC-chips 30 are moved to the unload station, by the robotic arm, after the IC-chips are tested at the test station.

Component 23 in FIG. 1 is an electronic control module for the chip testing system. This control module 23 is electrically coupled to each of the components 13-16 of the robotic arm by one set of conductors 23a. Also, the control module 23 is electrically coupled to each of the laser distance sensors 19a-19c by another set of conductors 23b. Further, the control module 23 is electrically coupled to an operator interface 24 by yet another set of conductors 23c.

One function which control module 23 performs is direct the movement of the carrier 17. To move the carrier 17 to a particular position in the "X" direction, or the "Y" direction, or the "Z" direction, the control module 24 sends control signals on the conductors 23a respectively to components 13, 14, or 15 of the robotic arm. Similarly, to tilt the carrier 17 at any particular angle in the θ direction, or the β direction, or the α direction, the control module 24 sends control signals on the conductors 23a to component 16 of the robotic arm.

A second function which control module 23 performs is sense the current position of the carrier 17. To that end, each of the components 13, 14, and 15 in the robotic arm include one linear position detector which generate encoded signals that respectively indicate the current position of the carrier 17 on the "X", "Y", and "Z" axis. Similarly, component 16 in the robotic arm includes three angular position detectors which generate encoded signals that respectively indicate the current angle of tilt of the carrier 17 in the θ, β, and α directions. All of these encoded signals are sent to the control module 23 on the conductors 23a.

A third function which control module 23 performs is activate the laser distance sensors 19a-19c. To do that, the control module 23 sends a command on the conductors 23b to the laser distance sensors 19a-19c. In response, each of the laser distance sensors 19a-19c makes a distance measurement and generates signals which indicate the result. Those signals are then sent to the control module 23 via the conductors 23b.

Under normal operating conditions, each group of IC-chips 30 which need to be tested is picked-up by the vacuum nozzles 18 at the load station as follows. First, the control module 23 sends control signals on the conductors 23a which direct the robotic arm 13-16 to a particular "load position" that has co-ordinates X1, Y1, Z1, θ1, β1, and α1. In this load position, the open ends of the vacuum nozzles 18 are aligned with and barely touch the IC-chips 30 on surface 30a of the load station. Then the control module 23 sends a control signal which opens a valve in a vacuum line that is connected to the vacuum nozzles 18. Note that this valve and vacuum line are not shown in FIG. 1 in order to simplify the drawing.

Similarly, under normal operating conditions, each group of IC-chips which is picked-up at the load station is subsequently put into the sockets 22 at the test station as follows. First, the control module 23 sends control signals on the conductors 23a which direct the robotic arm 13-16 to a particular "test position" that has co-ordinates X2, Y2, Z2, θ2, β2, and α2. In this test position, the IC-chips which are held by the vacuum nozzles 18 are aligned with and barely touch the sockets 22 on surface 21a of the test station. Then control module 23 sends control signals on the conductors 23a which direct the robotic arm to move by a predetermined distance in the −Z direction and thereby put the IC-chips into the sockets 22.

However, the co-ordinates X1, Y1, Z1, θ1, β1, and α1 of the load position, as well as the co-ordinates X2, Y2, Z2, θ2, β2, and α2 of the test position, vary each time the FIG. 1 chip testing system is manufactured. These variations are caused by the accumulation of multiple manufacturing tolerances which inherently occur in all of the components 10-24 in the FIG. 1 system.

But now, in accordance with the present invention, the control module 23 has a "start-up" mode of operation wherein the control module 23 automatically teaches itself what the co-ordinates X1 through α1 are at the load position, and what the co-ordinates X2 through α2 are at the test position. Thereafter, the control module 23 operates in the "normal" mode wherein it uses the co-ordinates X1 through α1 and X2 through α2 to repeatedly—1) pick-up IC-chips at the load station and move them to the sockets in the test station, and 2) pick-up IC-chips after they are tested at the test station and move them to the unload station. All of the details of how the control module 23 teaches itself will now be described with reference to FIGS. 2 and 3A-3F.

Figure 2:
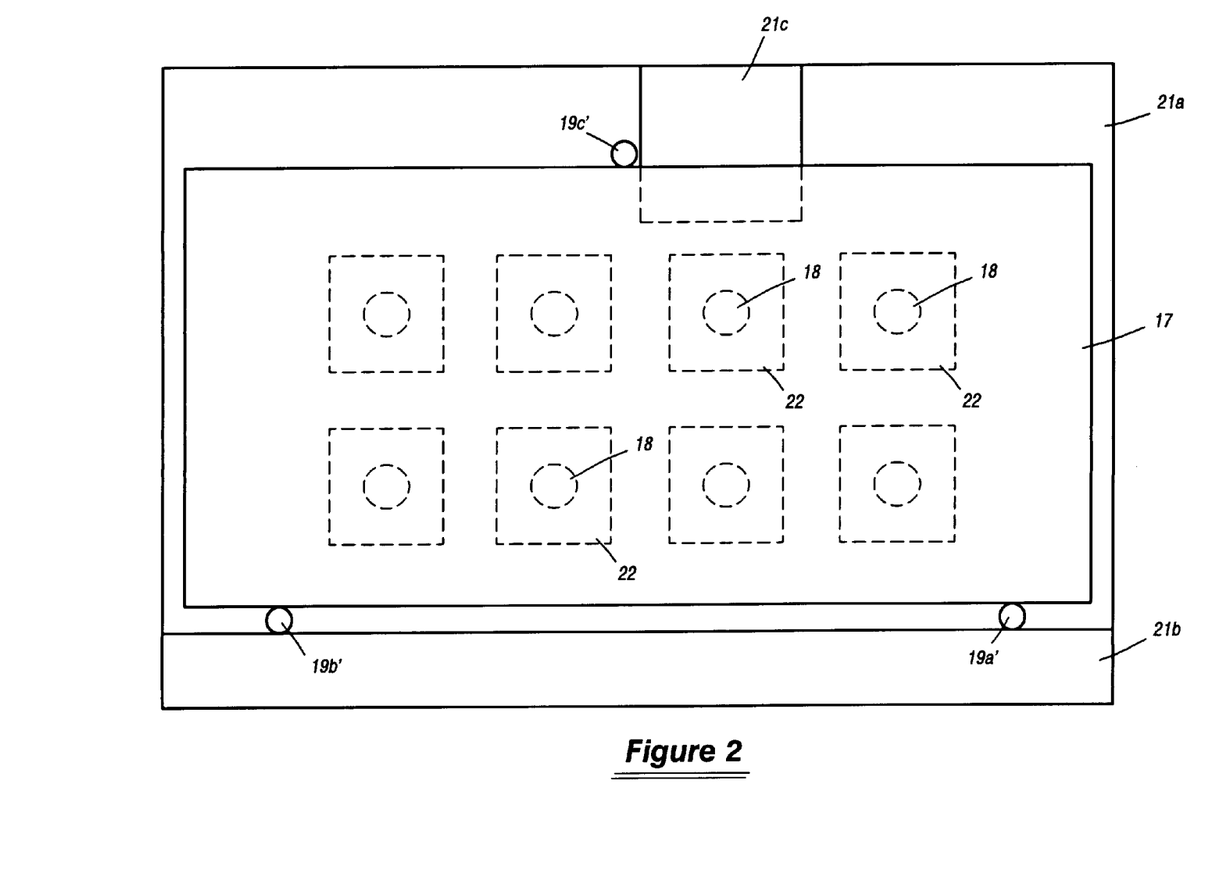
FIG. 2 is a top view of several components in the chip testing system of FIG. 1, which shows those components when they are aligned by the present invention.

In FIG. 2, the carrier 17 is shown in a top view at the test position. Also shown in FIG. 2 is a top view of the vacuum nozzles 18 which are attached to the carrier 17, and a top view of the laser beams 19a', 19b', and 19c' which respectively are emitted from the laser distance sensors 19a, 19b, and 19c of FIG. 1. Further shown in FIG. 2 is a top view of the planar surface 21a of the test station, a top view of the two steps 21b and 21c which are in surface 21a, and a top view of the sockets 22 which are attached to surface 21a.

Inspection of FIG. 2 shows that at the test position, the vacuum nozzles 18 are precisely aligned with the centers of the sockets 22. This alignment occurs when all three of the following conditions 1a-3a are met. Condition 1a is that the laser beams 19a' and 19b' begin to hit step 21b. Condition 2a is that the laser beam 19c' begins to hit step 21c. Condition 3a is that the distances which the laser beams 19a', 19b', and 19c' travel are equal to each other.

The above alignment occurs as long as the one subassembly of components 17, 18, and 19a-19c is accurately fabricated, and the other subassembly of components 21a-21c and 22 is accurately fabricated. When that occurs, the manufacturing tolerances in all of the other components in the chip testing system of FIG. 1 are irrelevant because those tolerances are cancelled out when the conditions 1a-3a are met.

Also, the alignment shown in FIG. 2 can be achieved even though the sockets 22 at the test station 21 are hidden from the view of an operator who works at the operator interface 24. This is because with the chip testing system of FIG. 1, the control module 21 automatically moves carrier 17 until the conditions 1a-3a are met. Then the control module 21 stores the co-ordinates X2, Y2, Z2, θ2, β2, and α2 that are sent from the robotic arm components 13-16 to the control module.

In a similar manner, the vacuum nozzles 18 on the carrier 17 are precisely aligned at the load station 20 with the centers of the IC-chips 30. This alignment is visually seen by simply changing the reference numerals 21a-21c and 22 in FIG. 2 to reference numerals 20a-20c and 30 respectively.

The vacuum nozzles 18 are precisely aligned with the IC-chips 30 at the load position when the following conditions 2a-2c are met. Condition 2a is that the laser beams 19a' and 19b' begin to hit step 20b. Condition 2b is that the laser beam 19c' begins to hit step 20c. Condition 2c is that the distances which the laser beams 19a'-19c' travel are equal to each other. The control module 23 in the FIG. 1 chip testing system automatically moves the carrier 17 until the conditions 2a-2c are met. Then the control module 23 stores the co-ordinates X1, Y1, Z1, θ1, β1, and α1 that are sent from the robotic arm components 13-16 to the control module.

One preferred process, which the control module 23 automatically performs in order to meet the conditions 1a-1c is shown in FIGS. 3A-3F. In all of those figures, reference numeral 17' identifies the triangular shaped plane which is formed by interconnecting the points where the laser beams 19a'-19c' exit the three laser distance sensors 19a-19c. All of the other reference numerals in FIGS. 3A-3F identify previously described components.

Figure 3A:
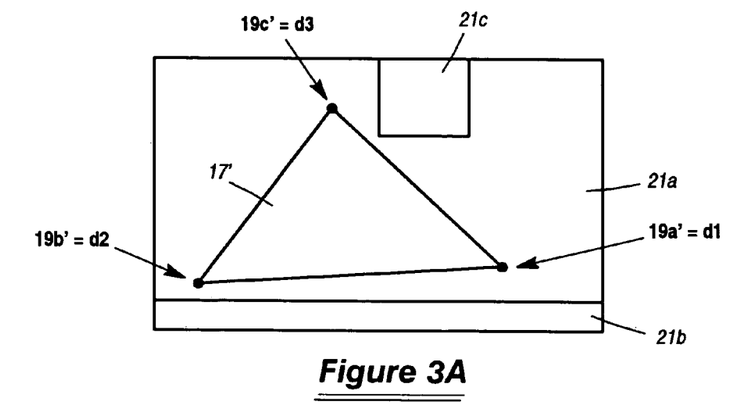
FIG. 3A illustrates some of the components in FIG. 2, when those components are at an initial position where the components are not aligned.

Initially, control module 23 directs the robotic arm to a predetermined position where the plane 17' is as shown in FIG. 3A. This position is selected such that the laser beams 19a' and 19b' hit surface 21a at two points which are spaced apart from the step 21b, and the laser beam 19c' hits surface 21a at a third point which is spaced apart from the step 21c.

The exact position of the laser beams 19a'-19c' in FIG. 3A relative to the steps 21b-21c is indeterminate, due to all of the cumulative manufacturing tolerances which are present in FIG. 1 chip testing system. Similarly, the exact angular orientation of the plane 17' relative to the planar surface 21a in FIG. 3A is indeterminate due to the manufacturing tolerances. Thus, in FIG. 3A, the distances d1-d3 measured by laser distance sensors 19a-19c are all different.

Figure 3B:
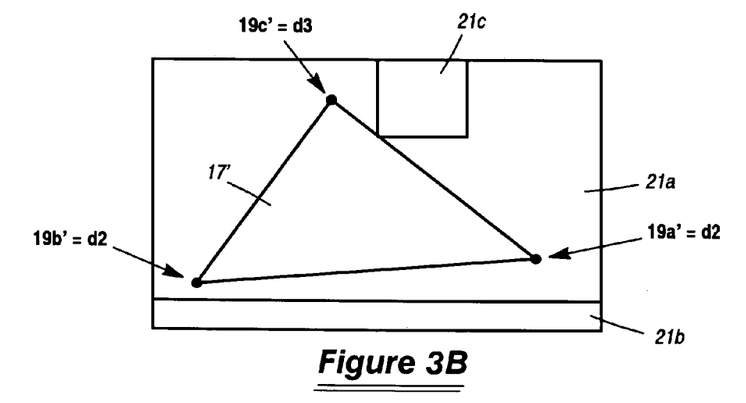
FIG. 3B illustrates the components of FIG. 3A at a first intermediate position before alignment occurs.
Figure 3C:
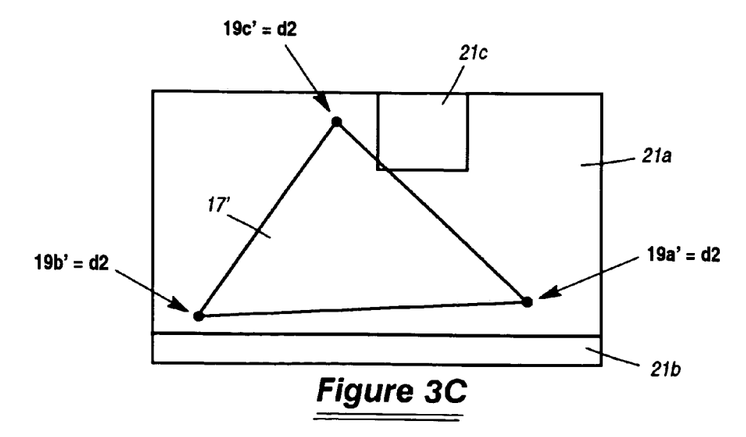
FIG. 3C illustrates the components of FIG. 3A at a second intermediate position before alignment occurs.

Next, control module 23 directs the robotic arm to move in small increments to a series of positions whereby the plane 17' eventually becomes parallel to the planar surface 21a. One point in this series is shown in FIG. 3B. There, the distances measured by two of the laser distance sensors 19a and 19b are equal to each other. The last point in this series is shown in FIG. 3C. There, the distances measured by all three of the lasers 19a-19c are equal to each other.

Each time control module 23 directs the robotic arm to move by an increment, the control module waits for that movement to be completed. Then, control module 23 sends a command to the laser distance sensors 19a-19c which causes them to take a distance measurement. Then, based on that distance measurement, control module 23 selects the liner direction and/or angular direction for the next incremental movement of the robotic arm.

Figure 3D:
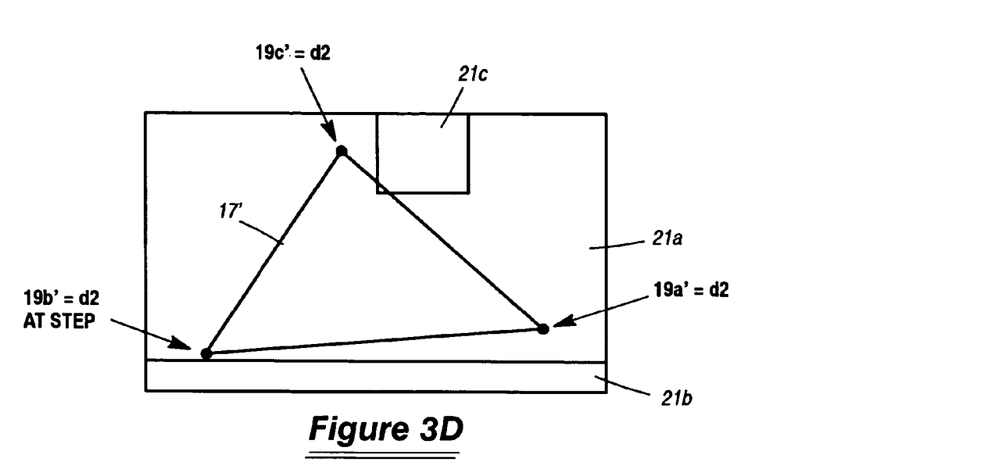
FIG. 3D illustrates the components of FIG. 3A at a third intermediate position before alignment occurs.

Next, control module 23 directs the robotic arm to move in small increments such that the plane 17' moves from the position shown in FIG. 3C to the position shown in FIG. 3D. During this move, the plane 17' remains parallel to surface 21a. Also during this move, the plane 17' is moved in a straight line towards the step 21b until one of the laser beams 19a' or 19b' start to hit that step.

Whether laser 19a', or laser beam 19b', will be first to hit step 21b is indeterminate. This is because the angular orientation of the plane 17', relative to the step 21b, is not known when the movement from the position shown in FIG. 3C begins. Thus, FIG. 3D illustrates just one example where the laser beam 19a' is first to hit the step 21b. To determine when the laser beam 19b' begins to hit the step 21b, control module 23 detects when a rapid change occurs in the distance that is measured by the laser distance sensor 19b.

Figure 3E:
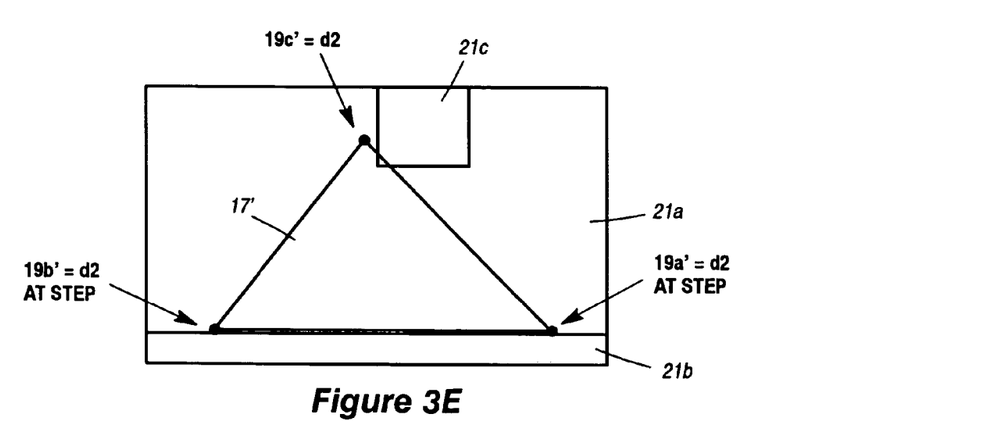
FIG. 3E illustrates the components of FIG. 3A at a fourth intermediate position before alignment occurs.

Next, control module 23 directs the robotic arm to move in small increments such that the plane 17' moves from the position shown in FIG. 3D to the position shown in FIG. 3E. During this movement, the plane 17' again remains parallel to surface 21a. Also during this movement, the plane 17' is rotated until both of the laser beams 19a' and 19b' start to hit step 21b. To determine when both of the laser beams 19a' and 19b' start to hit step 21b, the control module 23 detects a rapid change in the distances that are measured by both of the laser distance sensors 19a and 19b, when plane 17' is moved parallel to surface 21a and perpendicular to a line through the laser beams 19a' and 19b'.

Figure 3F:
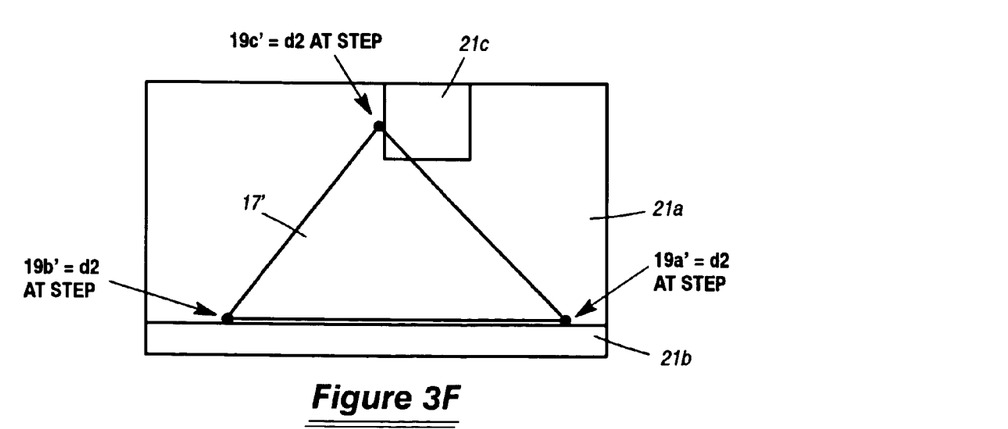
FIG. 3F illustrates the components of FIG. 3A at a final position where alignment occurs.

Lastly, control module 23 directs the robotic arm to move in small increments such that the plane 17' moves from the position shown in FIG. 3E to the position shown in FIG. 3F. During this movement, the plane 17' again remains parallel to surface 21a. Also during this movement, the laser beams 19a' and 19b' travel parallel to the step 21b. The final position of FIG. 3F is reached when the laser beam 19c' begins to hit the step 21c. To determine when this occurs, the control module 23, detects a rapid change in the distance that is measured by the laser distance sensor 19b.

When plane 17' reaches the position shown in FIG. 3F, the control module 23 stores the co-ordinates X2, Y2, Z2, θ2, β2, and α2 which it receives from the robotic arm components 13-16 of FIG. 1. Then, control module 23 moves the carrier 17 to a predetermined position over the load station 20 of FIG. 1. Then, control module 23 performs the steps of FIGS. 3A-3F at the load station and stores the co-ordinates X1, Y1, Z1, θ1, β1, and α1. Thereafter, the control module 23 operates in the normal mode wherein it repeatedly uses the stored co-ordinates X1 through α1 and X2 through α2, as previously described.

One preferred method of operating an IC-chip tester, in accordance with the present invention, has now been described in detail. Next, several modifications to that method will be described.

As a first modification, the shape of steps 21b and 21c in the planar surface 21a of the test station, can be changed from the shape that is shown in FIGS. 1, 2, and 3A-3F. For example, one particular change is shown in FIG. 4, and another particular change is shown in FIG. 5.

Figure 4:
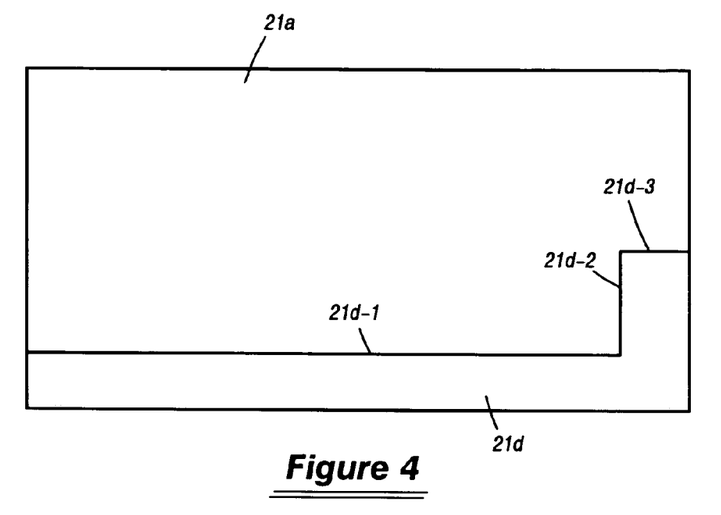
FIG. 4 shows one particular modification which can be made to the embodiment of the invention that is illustrated in FIGS. 1, 2, and 3A-3F.

In FIG. 4, the planar surface 21a of the test station has only a single continuous step 21d. This step 21d includes three edges 21d-1, 21d-2, and 21d-3 which are oriented on surface 21a of the test station as shown.

Using step 21d of FIG. 4, the control module 23 aligns the vacuum nozzles 18 with the sockets 22 as shown in FIG. 2, by the following process. Initially, the plane 17' is moved in small increments to the positions that are shown in FIGS. 3A, 3B, and 3C. Them the plane 17' is moved in small increments from the FIG. 3C position to a position which is the same as that shown in FIG. 3D except that the laser beam 19b' hits edge 21d-1. Next, plane 17' is moved in small increments to a position which is the same as that shown in FIG. 3E except that both of the laser beams 19a' and 19b' hit edge 21d-1. Lastly, plane 17' is moved in small increments to a position which is the same as that shown in FIG. 3F, except that both of the laser beams 19a' and 19b' hit edge 21b-1, and laser beam 19b' also hits edge 21b-2.

Figure 5:
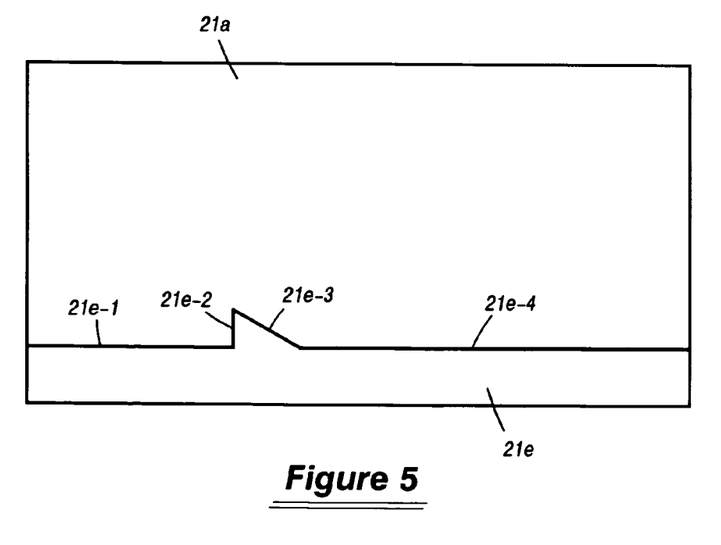
FIG. 5 shows another modification which can be made to the embodiment of the invention that is illustrated in FIGS. 1, 2, and 3A-3F.

In FIG. 5, the planar surface 21a of the test station again has only a single continuous step 21e. But this step 21e includes four edges 21e-1, 21e-2, 21e-3, and 21e-4 which are oriented on surface 21a of the test station as shown.

Using step 21e of FIG. 5, the control module 23 aligns the vacuum nozzles 18 with the sockets 22 as shown in FIG. 2, by the following process. Initially, the plane 17' is moved in small increments to the positions that are shown in FIGS. 3A, 3B, and 3C. Them the plane 17' is moved in small increments from the FIG. 3C position to a position which is the same as that shown in FIG. 3D except that the laser beam 19b' hits edge 21e-1. Next, plane 17' is moved in small increments to a position which is the same as that shown in FIG. 3E except that laser beam 19b' hits edge 21e-1, and laser beam 19a' hits edge 21e-4. Lastly, plane 17' is moved in small increments to a position which is the same as that shown in FIG. 3F, except that laser beam 19b' hits both of the edges 21e-1 and 21e-2, and laser beam 19a' hits edge 21e-4.

As a second modification, each of the steps in the previously described FIGS. 1, 2, 3A-3F, 4 and 5 can be an upward step in the +Z direction, or a downward step in the -Z direction. Also, each of those steps can have any height as long as the edge of the step can be detected by control module 23 from the signals which the control module receives from the laser distance sensors 19a-19c. In one particular embodiment, each of the laser distance sensors was model 0ADM-1216460/S35A that is sold by Baumer Electric Corporation; and with it, the edge of a step which is only sixty-thousandths of an inch high is accurately detected.

As a third modification, each of the steps in the previously described FIGS. 1, 2, 3A-3F, 4 and 5 can be changed to a ramp which has an upward incline or a downward incline. However, as the slope of the incline decreases, the accuracy of detecting where the incline starts also decreases.

Figure 6:
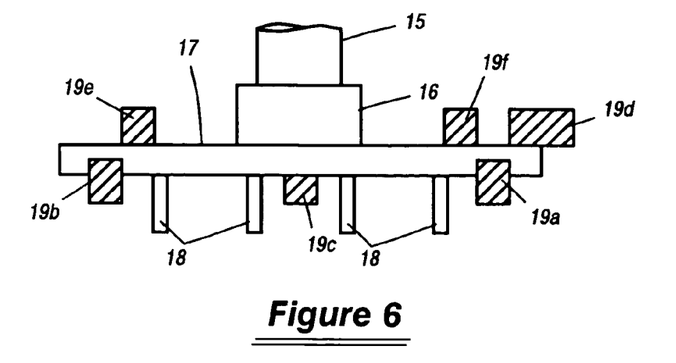
FIG. 6 shows a side view of still another modification which can be made to the embodiment of the invention that is illustrated in FIGS. 1, 2, and 3A-3F.
Figure 7:
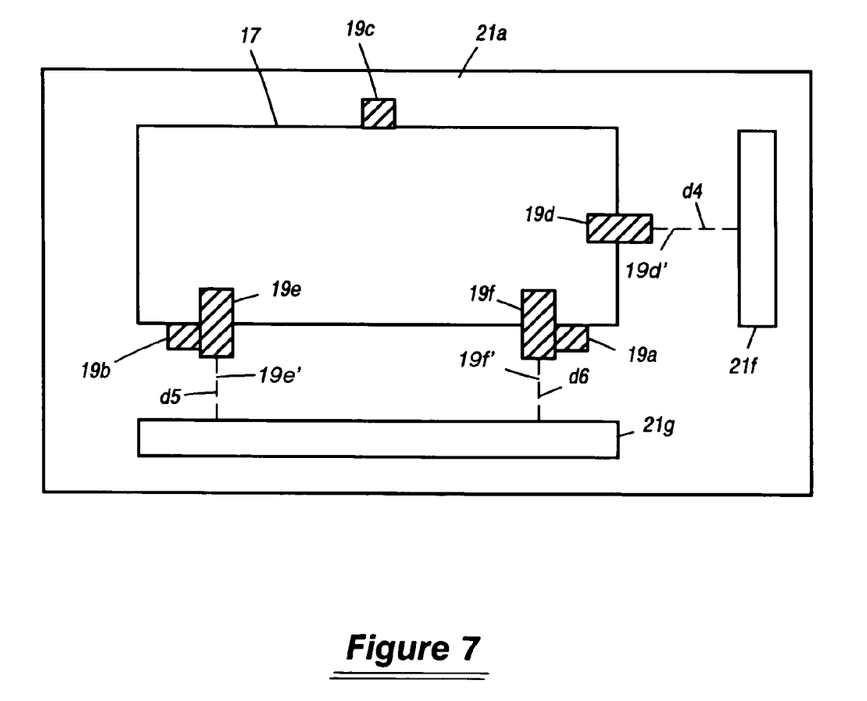
FIG. 7 is a top view of the modification that is shown in FIG. 6.

As a fourth modification, three additional laser distance sensors 19d, 19e, and 19f are attached to the carrier 17, as shown in FIGS. 6 and 7. These laser distance sensors 19d-19f measure distance in a plane which is parallel to the plane where the open end of the vacuum nozzles 18 lie. However, the laser distance sensor 19d measures distance in a direction that is perpendicular to the direction in which the laser distance sensors 19e and 19f measure distance.

The above perpendicular directions are illustrated in FIG. 7. There, the laser distance sensor 19d emits laser beam 19d', whereas the laser distance sensors 19e and 19f emit respective laser beams 19e' and 19f'.

Also in this modification of FIGS. 6 and 7, two flat reference members 21f and 21g are attached perpendicular to the planar surface 21a of the test station. Laser distance sensor 19d measures the distance d4 to member 21f, whereas the two laser distance sensors 19e and 19f respectively measure distances d5 and d6 to the member 21g. The steps 21b and 21c that were shown in FIGS. 2 and 3A-3F, are eliminated.

Using the modification of FIGS. 6 and 7, the control module 23 aligns the vacuum nozzles 18 with the sockets 22 as shown in FIG. 2, by performing the following process. Initially, the carrier 17 is moved in small increments to the positions that are shown in FIGS. 3A, 3B, and 3C. Then the carrier 17 is moved in small increments from the FIG. 3C position to a position that corresponds to the position shown in FIG. 3D where the distance d5, as measured by the laser distance sensor 19e, equals a first predetermined distance. Next, the carrier 17 is moved in small increments to a position that corresponds to the position shown in FIG. 3E where the distance d5 and d6, as measured by the laser distance sensors 19e and 19f, both equal the above first predetermined distance. Lastly, the carrier 17 is moved to a position that corresponds to the position shown in FIG. 3F where—1) the distances d5 and d6, as measured by the laser distance sensors 19e and 19f, both equal the first predetermined distance, and 2) the distance d4, as measured by the laser distance sensor 19d, equals a second predetermined distance.

As a fifth modification, only four of the laser distance sensors 19a, 19b, 19c, and 19d are attached to the carrier 17 as shown in FIGS. 6 and 7, and the remaining two laser distance sensors 19e and 19f are deleted. Also, in this modification, the reference member 21g in FIG. 7 is replaced with the step 21b of FIG. 2.

Using this fifth modification, control module 23 aligns the vacuum nozzles 18 with the sockets 22 as shown in FIG. 2, by performing the following process. First, the carrier 17 is moved in small increments to the positions that are shown in FIGS. 3A, 3B, 3C, 3D, and 3E. Then, the carrier 17 is moved to a position which is the same as that shown in FIG. 3F except the distance d4, as measured by the laser distance sensor 19d, equals a predetermined distance.

Similarly, as a sixth modification, only five of the laser distance sensors 19a, 19b, 19c, 19e, and 19f are attached to the carrier 17 as shown in FIGS. 6 and 7, and the remaining laser distance sensor 19d is deleted. Also in this modification, the reference member 21f in FIG. 7 is replaced with step 21c of FIG. 2.

Using this sixth modification, control module 23 aligns the vacuum nozzles 18 with the sockets 22 as shown in FIG. 2, by performing the following process. Initially, the carrier 17 is moved in small increments to the positions that are shown in FIGS. 3A, 3B, and 3C. Then the carrier 17 is moved in small increments from the FIG. 3C position to a position that corresponds to the position shown in FIG. 3D where the distance d5, as measured by the laser distance sensor 19e, equals a first predetermined distance. Next, the carrier 17 is moved in small increments to a position that corresponds to the position shown in FIG. 3E where the distance d5 and d6, as measured by the laser distance sensors 19e and 19f, both equal the above first predetermined distance. Lastly, the carrier 17 is moved to a position that corresponds to the position shown in FIG. 3F where—1) the distances d5 and d6, as measured by the laser distance sensors 19e and 19f, both equal the first predetermined distance, and 2) the laser beam 19c', from the laser distance sensor 19c, begins to hit the step 21c as shown in FIG. 3F.

To perform any one of the processes which have been described above, control module 23 preferable includes a programmable microprocessor and a memory. The memory stores instructions which the microprocessor sequentially executes and thereby performs all of the steps of the processes, as described above.

Several preferred processes which incorporate the present invention have now been described in detail. In addition, however, many modifications can be made to these details without departing from the gist of the present invention. Accordingly, it is to be understood that the present invention is not limited to just the details of the above described preferred processes, but is defined by the appended claims.

What is claimed is:

1. A method of automatically carrying IC-chips, on a planar array of vacuum nozzles, to a variable target in a chip tester; said method including the steps of:
    measuring a set of distances, to a reference in said chip tester for said target, with a set of lasers that are attached to said planar array of nozzles;
    selecting a direction and/or angle of movement as a function of the measured set of distances, using a control module in said chip tester;
    moving said planar array of nozzles, via a robotic arm in said chip tester, by an increment in the direction and/or angle selected by said control module;
    repeating said measuring, selecting, and moving steps until said control module detects that the distances measured by said lasers meet a predetermined criteria;
    storing control signals by the control module in said chip tester which identify the particular position of said robotic arm when the distances measured by said lasers meet said predetermined criteria; and thereafter,
    carrying IC-chips on said planar array of nozzles while said control module uses the stored control signals to move said robotic arm to said particular position.

2. A method according to claim 1 wherein said measuring step uses only three lasers to measure three distances perpendicular to said planar array of nozzles.

3. A method according to claim 2 wherein said repeating of said measuring, selecting, and moving steps drive said planar array of nozzles to a first intermediate position where said three distances measured by said three lasers are equal to each other.

4. A method according to claim 3 wherein said repeating of said measuring, selecting, and moving steps drive said planar array of nozzles from said first intermediate position such that said three measured distances remain equal to each other until a second intermediate position is reached where the distances measured by two of said three lasers immediately start to change if said planar array of nozzles is moved perpendicular to a centerline through said two lasers.

5. A method according to claim 4 wherein said repeating of said measuring, selecting, and moving steps drive said planar array of nozzles from said second intermediate position such that—a) said three measured distances remain equal to each other and b) said planar array of nozzles travel parallel to said centerline until a final position is reached where the distances measured by the third of said three lasers immediately starts to change.

6. A method according to claim 4 wherein said repeating of said measuring, selecting, and moving steps drive said planar array of nozzles from said second intermediate position such that—a) said three measured distances remain equal to each other and b) said planar array of nozzles travel parallel to said centerline until a final position is reached where the distances measured by one of said two lasers immediately starts to change.

7. A method according to claim 1 wherein said measuring step uses three lasers to measure three distances perpendicular to said planar array of nozzles and uses three additional lasers to measure three additional distances parallel to said planar array of nozzles.

8. A method according to claim 7 wherein said repeating of said measuring, selecting, and moving steps drive said planar array of nozzles to a first intermediate position where said three distances measured by said three lasers are equal to each other.

9. A method according to claim 8 wherein said repeating of said measuring, selecting, and moving steps drive said planar array of nozzles from said first intermediate position such that said three distances measured by said three lasers remain equal to each other until a second intermediate position is reached where the distances measured by two of said additional lasers are equal to each other.

10. A method according to claim 9 wherein said repeating of said measuring, selecting, and moving steps drive said planar array of nozzles from said second intermediate position such that—a) said three distances measured by said three lasers remain equal to each other and b) said distances measured by said two additional lasers remain equal to each other until a final position is reached where the distances measured by the third additional laser equals a predetermined distance.

11. A method according to claim 1 wherein said measuring step uses three lasers to measure distances perpendicular to said planar array of nozzles and only one additional laser to measure distances parallel to said planar array of nozzles.

12. A method according to claim 1 wherein said measuring step uses three lasers to measure distances perpendicular to said planar array of nozzles and only two additional lasers to measure distances parallel to said planar array of nozzles.

13. A method according to claim 1 wherein said repeating of said measuring, selecting, and moving steps is performed inside of said chip tester in a region which is hidden from view on the outside of said chip tester.

* * * * *